United States Patent
Kim

(10) Patent No.: US 7,772,915 B2
(45) Date of Patent: Aug. 10, 2010

(54) TEMPERATURE SENSING CIRCUIT AND METHOD USING DLL

(75) Inventor: Jin-Gook Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 12/130,117

(22) Filed: May 30, 2008

(65) Prior Publication Data

US 2008/0297228 A1 Dec. 4, 2008

(30) Foreign Application Priority Data

Jun. 1, 2007 (KR) .................. 10-2007-0053673

(51) Int. Cl.
*H01L 35/00* (2006.01)
*G01K 7/00* (2006.01)

(52) U.S. Cl. .............. 327/512; 374/170; 327/513; 327/159

(58) Field of Classification Search .......... 327/512, 327/513; 374/170, 171
See application file for complete search history.

(56) References Cited

U.S. PATENT DOCUMENTS

| | | | |
|---|---|---|---|
| 6,252,443 B1 * | 6/2001 | Dortu et al. | 327/156 |
| 7,082,070 B2 | 7/2006 | Hong | |
| 7,619,486 B1 * | 11/2009 | Lesea | 331/176 |
| 7,639,054 B1 * | 12/2009 | Burney | 327/161 |
| 2006/0170472 A1 * | 8/2006 | Suda et al. | 327/158 |
| 2009/0141770 A1 * | 6/2009 | Chen et al. | 374/170 |

FOREIGN PATENT DOCUMENTS

| | | |
|---|---|---|
| KR | 2000-232344 | 8/2000 |
| KR | 10-0627368 | 9/2006 |

OTHER PUBLICATIONS

English language abstract of Korean Publication No. 2000-232344.
English language abstract of Korean Publication No. 10-0627368.

* cited by examiner

*Primary Examiner*—Lincoln Donovan
*Assistant Examiner*—Ryan C Jager
(74) *Attorney, Agent, or Firm*—Stanzione & Kim, LLP

(57) ABSTRACT

A temperature sensing circuit using a delay locked loop and a temperature sensing method. The temperature sensing circuit includes a locked delay unit for receiving an external clock and generating a locked delay pulse keeping a constant delay amount regardless of temperature. A variable delay unit may have a chain structure of a plurality of delay cells depending upon temperature. The variable delay unit may receive the external clock and generate variable delay pulses having respectively different delay amounts based on temperature. A decision control unit is configured to sense a determination temperature by using a phase difference between one selected from the variable delay pulses and the locked delay pulse. Accordingly, an unnecessary time and cost causable by temperature compensation can be reduced, and an automatic temperature compensation and a precise temperature sensing operation can be obtained.

22 Claims, 12 Drawing Sheets

TEMPERATURE SENSING CIRCUIT AND METHOD USING DLL

CROSS REFERENCE TO RELATED APPLICATIONS

This application claims priority under 35 U.S.C. §119 from Korean Patent Application 10-2007-0053673, filed on Jun. 1, 2007, the contents of which are hereby incorporated by reference in their entirety for all purposes as if fully set forth herein.

BACKGROUND AND SUMMARY

1. Technical Field

The present invention relates to semiconductor memories. More particularly, the present invention relates to a temperature sensing circuit using a delay locked loop (DLL) and a temperature sensing method thereof, capable of reducing time and cost through an automatic compensation of sensed temperature.

2. Description

A temperature sensor is generally used in various industry fields relating to temperature. Particularly in a semiconductor memory field, it has been mainly used for a refresh operation of semiconductor memories.

In general, a DRAM (Dynamic Random Access Memory) is a unit memory device capable of writing data such that when storing data of '1' in a memory cell, a high potential is applied to and held by the memory cell, thereby writing data. And when storing data of '0', a low potential is applied to and held by the memory cell, thereby writing data.

A gathered charge should keep a constant level in the state so that a capacitor of the memory cell has an ideal state, and so that potential in a connection terminal of the capacitor is not changed. In actuality, in a characteristic aspect of a capacitor, the stored charge leaks as leakage current as time lapses. Thus it is difficult to check and confirm whether the written data is '1' or '0'.

To constantly keep data, therefore, the memory device needs to periodically sense and amplify data stored in the memory cell. Also, it is necessarily required to re-store the data in the memory cell. Such serial procedures are called a refresh.

As temperature increases, a data maintenance time of the semiconductor memory cell is reduced. In other words, a data loss in the memory cell caused by an end of data maintenance time can be prevented by refreshing the semiconductor memory cell before the data maintenance time of the semiconductor memory is ended. A period of such refresh operation is decided so that the refresh operation is performed on the basis that the semiconductor memory cell has a relatively high temperature.

Unlike a relatively high temperature required for the refresh operation, in a general temperature, predetermined matching to a relatively high temperature is performed even though a data maintenance time is not completed. This may be ineffective because the refresh operation is performed in the semiconductor memory cell in the general temperature and so a general operation such as read/write cannot be implemented.

A solution to such problem may include using a temperature sensor to perform a refresh operation in a semiconductor memory cell. An internal temperature of the semiconductor memory device can be sensed through the temperature sensor, thereby controlling a refresh period according to the sensed temperature. However, this requires a relatively faster and more precise temperature sensing operation.

FIG. 1 illustrates a structure of temperature sensing circuit according to a conventional art. Referring to FIG. 1, a temperature sensing circuit includes a first delay 10, second delay 20 and D flip-flop 30.

In the first delay 10, an inverter, in which a voltage having a level higher than a reference power voltage is used as a power voltage level High VDD, is provided as a delay cell, and a plurality of the delay cells IVT10, IVT12 ... IVTn-2, and IVTn, are connected in series. The first delay 10 receives an external clock ECLK from the outside, and generates a first delay pulse DP1, and transfers the pulse to the D flip-flop 30. The first delay pulse DP1 has a characteristic delay amount that increases according to a temperature increase.

The second delay 20 has a structure that includes a voltage having a level lower than the reference power voltage, the voltage being a power voltage level Low VDD. An inverter is provided as a delay cell, and a plurality of the delay cells IVT20, IVT22 ... IVT2n-2, and IVT2n, are connected in series. The second delay 20 receives external clock ECLK from the outside, and generates a second delay pulse DP2, and transfers the pulse to the D flip-flop 30. The second delay pulse DP2 has a characteristic delay amount that decreases according to a temperature increase.

The D flip-flop 30 receives the first delay pulse DP1 as data, and receives the second delay pulse DP2 as a clock, then performs a corresponding operation. For example, a state of the first delay pulse DP1 provided at a rising edge of the second delay pulse DP2 is output as the data.

A general temperature sensing operation based on an internal temperature change of the semiconductor memory device is described as follows.

A determination temperature in the general temperature sensing circuit indicates temperature to be sensed within the semiconductor memory device. When internal temperature of the semiconductor memory device is lower than the determination temperature, the first delay 10 generates first delay pulse DP1 of a fast phase and outputs it to the D flip-flop 30. At this time, the second delay 20 generates second delay pulse DP2 having a relatively slow phase as compared with the first delay pulse DP1, and outputs it to the D flip-flop 30.

The D flip-flop 30 outputs a state of the first delay pulse DP1 provided at a rising edge time point of the second delay pulse DP2 as data. At this time, the first delay pulse DP1 has a phase faster than the second delay pulse DP2, thus the first delay pulse DP1 has a high level at the rising edge time point of the second delay pulse DP2 and so the D flip-flop 30 outputs data of a high level. Accordingly, it can be confirmed that internal temperature is lower than the determination temperature.

To the contrary, when internal temperature of the semiconductor memory device is higher than the determination temperature, the first delay 10 generates first delay pulse DP1 of a slow phase and outputs it to the D flip-flop 30. At this time, the second delay 20 generates second delay pulse DP2 having a relatively fast phase as compared with the first delay pulse DP1, and outputs it to the D flip-flop 30.

At this time, the first delay pulse DP1 has a phase slower than the second delay pulse DP2. Thus, the first delay pulse DP1 has a low level at the rising edge time point of the second delay pulse DP2, and so the D flip-flop 30 outputs data of a low level. Accordingly, internal temperature can be clarified to be higher than the determination temperature.

That is, when the internal temperature is lower than the determination temperature, a high level signal is output, and when the measured temperature is higher, a low level signal is output, thereby performing an operation corresponding to an internal temperature change of a semiconductor memory device.

However, it often occurs that an actually measured temperature may deviate from a determination temperature targeted in designing a temperature sensing circuit due to a process fluctuation and an error of model parameter and design etc. Therefore, a calibration (hereinafter, referred to as 'compensation') operation is required for a compensation of a temperature trip point. The compensation operation is performed by measuring a trip point of temperature through a normal test MRS (Mode Register Set), and by fusing it through laser. Specifically, the compensation operation is performed by adjusting a stage number of delay cells constituting the first or second delay 10 or 20, or by locking power source voltage VDD supplied to the first or second delay 10 or 20 through a control of a regulator.

However, in this case, it is inconvenient to have to find out one by one a trip point through the test MRS and fuse it as a determination temperature in order to perform the compensation operation. This requires much time and cost, particularly in a semiconductor memory field based on a characteristic of mass production.

Accordingly, some embodiments of the invention provide a temperature sensing circuit using a delay locked loop and a temperature sensing method thereof. A consumption of time and cost through the temperature compensation of a sensed temperature can be reduced, and a temperature compensation operation can be performed automatically. Additionally a precise temperature sensing operation can be obtained.

According to an embodiment of the invention, a temperature sensing circuit using a delay locked loop comprises a locked delay unit for receiving an external clock and generating a locked delay pulse keeping a constant delay amount regardless of temperature; a variable delay unit having a chain structure of a plurality of delay cells depending upon temperature, the variable delay unit being for receiving the external clock and generating a plurality of variable delay pulses having respectively different delay amounts based on temperature; and a decision control unit for sensing a determination temperature by using a phase difference between one selected from the variable delay pulses and the locked delay pulse.

The locked delay unit may comprise one delay cell having a structure of at least one inverter. A delay cell of the variable delay unit may be an inverter. The decision control unit may comprise a D flip-flop for receiving the locked delay pulse as a reference clock and receiving the one selected variable delay pulse as data, and outputting a corresponding delay pulse to the outside. The temperature sensing circuit may further comprise at least one delay locking unit for selecting a variable delay pulse that synchronizes to the locked delay pulse at a predetermined temperature, from the variable delay pulses, and locking the selected pulse.

The delay locking unit may comprise a phase sensor and a multiplexer. The phase sensor repetitively performs an operation of comparing a phase of one of the variable delay pulses with a phase of the locked delay pulse, and generating its corresponding comparison signal, until the delay is locked. The multiplexer repetitively performs an operation of selecting one variable delay pulse corresponding to the comparison signal of the phase sensor, from the variable delay pulses, and outputting the selected pulse to the phase sensor, until the delay is locked.

The delay locking unit may further comprise a counter for generating a count signal to provide as a selection reference of variable delay pulse in the multiplexer in response to the comparison signal output from the phase sensor. The delay locking unit may further comprise a fusing unit for performing a fusing operation so that a variable delay pulse selected in locking a delay amount in the delay locking unit is locked and output to the decision control unit through the multiplexer. When the number of temperatures to be sensed is plural, the delay locking units may be further adapted corresponding to the number of sensing temperatures.

According to another embodiment of the invention, a temperature sensing compensation circuit using a delay locked loop comprises a locked delay unit for generating a locked delay pulse having a constant delay regardless of temperature, a variable delay unit having a chain structure of a plurality of delay cells depending upon temperature, the variable delay unit being for receiving an external clock and generating a plurality of variable delay pulses having different delay amounts based on temperature, and a delay locking unit for repetitively performing an operation of selecting one variable delay pulse that synchronizes to the locked delay pulse at a predetermined temperature, from the variable delay pulses, until the delay is locked. The temperature sensing compensation circuit may further comprise a fusing unit for performing a fusing operation so that the selected variable delay pulse is locked and output, in locking the delay amount of the delay locking unit. When the number of determination temperatures to be sensed is plural, the delay locking unit may be adapted corresponding to the plural number thereof.

According to another embodiment of the invention, an operating method of a temperature sensing circuit using a delay locked loop comprises a first step of receiving an external clock input from the outside and generating a locked delay pulse having a locked delay amount regardless of temperature, and receiving the external clock and generating a plurality of variable delay pulses having different delay amounts according to a temperature change; and a second step of sensing a determination temperature by using a phase difference between one selected from the variable delay pulses and the locked delay pulse. The method may further comprise, before the second step, selecting a variable delay pulse synchronizing to the locked delay pulse from the plurality of variable delay pulses and locking it at the determination temperature, and compensating the sensed temperature.

According to another embodiment of the invention, a temperature sensing compensation method using a delay locked loop comprises a first step of receiving an external clock input from the outside and generating a locked delay pulse having a locked delay amount regardless of temperature, and receiving the external clock and generating a plurality of variable delay pulses having different delay amounts according to temperature; a second step of selecting one of the plurality of variable delay pulses and then comparing a phase of the one selected variable delay pulse with a phase of the locked delay pulse, and deciding whether the phases are identical; and a third step of locking the selected variable delay pulse when the phases of the selected variable delay pulse and the locked delay pulse are identical, and repetitively performing the second step until the phases become identical, when the phases are not identical.

In the second step it can be decided whether the phases are identical through a generation of up/down signal as a phase comparison signal between the locked delay pulse and the selected variable delay pulse. The third step may further comprise, when phases between the selected variable delay pulse and the locked delay pulse are identical, performing a fusing operation so that the selected variable delay pulse is locked and output, or when not identical, generating a count signal to reselect a variable delay pulse. The method may further comprise a fourth step of repetitively performing the first to third steps at each determination temperature when the number of determination temperatures is plural.

According to another embodiment of the invention, a temperature sensing circuit using a delay locked loop comprises a locked delay unit for generating a locked delay pulse having a constant delay regardless of a temperature change; a variable delay unit for generating a plurality of variable delay pulses having different delay amount that is changed depending upon the temperature change; a plurality of delay locking units for performing independently every plural determination temperatures, an operation of selecting a variable delay pulse synchronizing to the locked delay pulse from the plurality of variable delay pulses generated under a determination temperature state, and locking it, in a compensation operating mode, and for outputting variable delay pulses locked corresponding to each of the plurality of determination temperatures in a sensing temperature state in a temperature sensing mode; and at least one decision control unit for comparing a phase of at least one of the variable delay pulses output from the delay locking units with a phase of the locked delay pulse, and outputting at least one temperature signal.

The delay locking units may be provided corresponding to the number of sensing temperatures or the number of determination temperatures. Each of the delay locking units may comprise a multiplexer, phase sensor, counter and fusing unit. One decision control unit is adapted in the temperature sensing circuit. The temperature sensing circuit may further comprise a multiplexer for selecting one delay locking unit corresponding to a determination temperature from the plurality of delay locking units, and providing variable delay pulse to the decision control unit. The temperature sensing circuit may comprise a plurality of decision control units that are adapted corresponding to the number of the delay locking units and that individually corresponds thereto. The plurality of decision control units may simultaneously compare the respective variable delay pulses provided from the respective delay locking units, with the locked delay pulse, and output a plurality of temperature signals.

According to another embodiment of the invention, a temperature sensing method using a delay locked loop comprises starting a compensation operating mode; generating a locked delay pulse having a locked delay amount regardless of temperature under a specific determination temperature, and a plurality of variable delay pulses having a delay amount changed according to a temperature change; performing independently every plural determination temperatures, an operation of selecting a variable delay pulse synchronizing to the locked delay pulse from the plurality of variable delay pulses, and locking it; starting a temperature sensing mode; and comparing a phase of variable delay pulse locked corresponding to a determination temperature selected from the plurality of determination temperatures, with a phase of the locked delay pulse, and sensing a temperature, in a sensing temperature state.

Accordingly, a consumption of time and cost required for a temperature compensation can be reduced, and further, an automatic temperature compensation and a precise temperature sensing operation can be obtained.

BRIEF DESCRIPTION OF THE DRAWINGS

The present invention will become more fully understood from the detailed description given below and the accompanying drawings, which are given by way of illustration only, and thus are not limitative of the present invention, wherein.

DETAILED DESCRIPTION

Embodiments of the present invention now will be described more fully hereinafter with reference to FIGS. 2 to 12, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 12. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
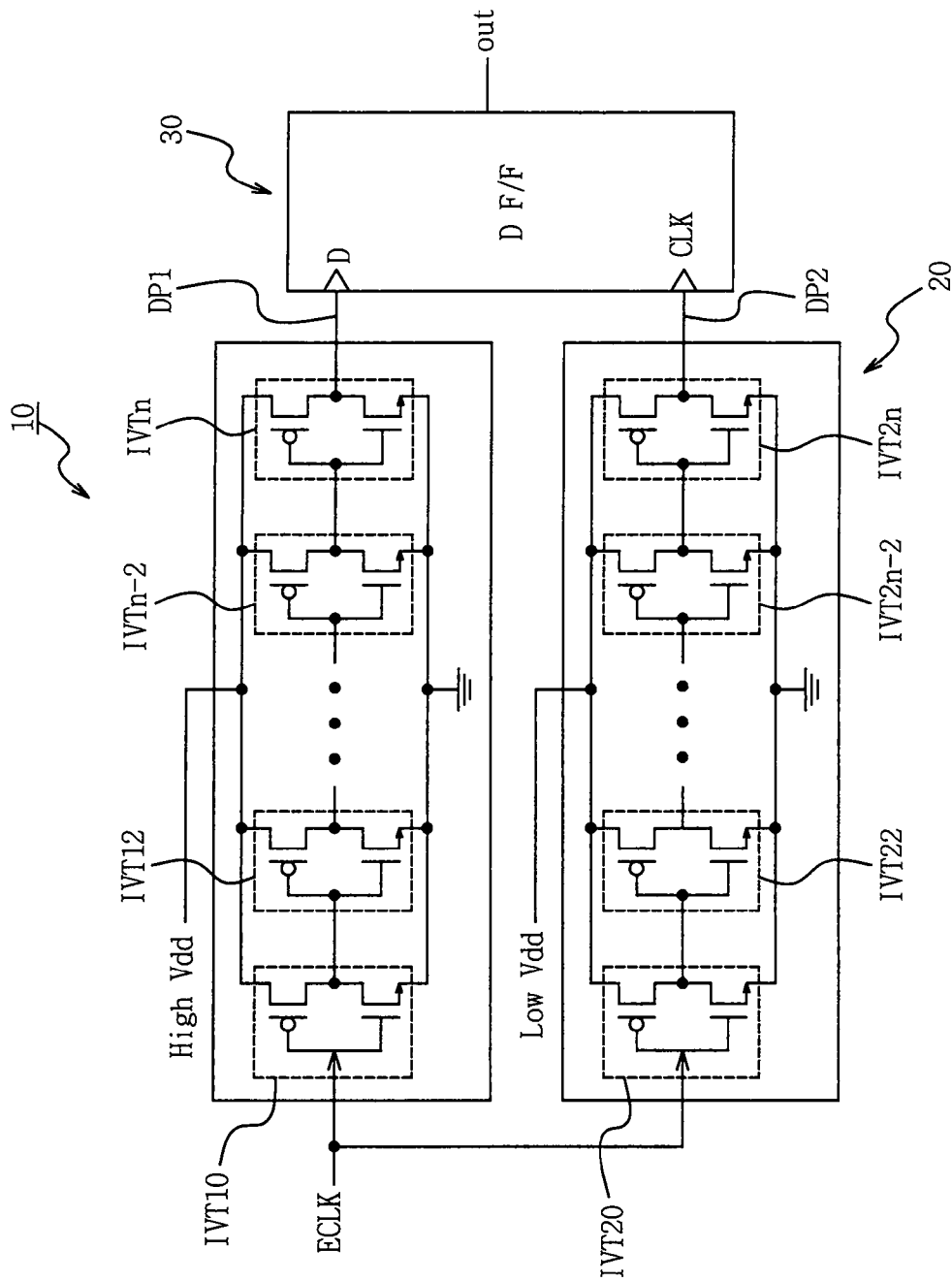
FIG. 1 illustrates a structure of temperature sensing circuit according to a conventional art.
Figure 2:
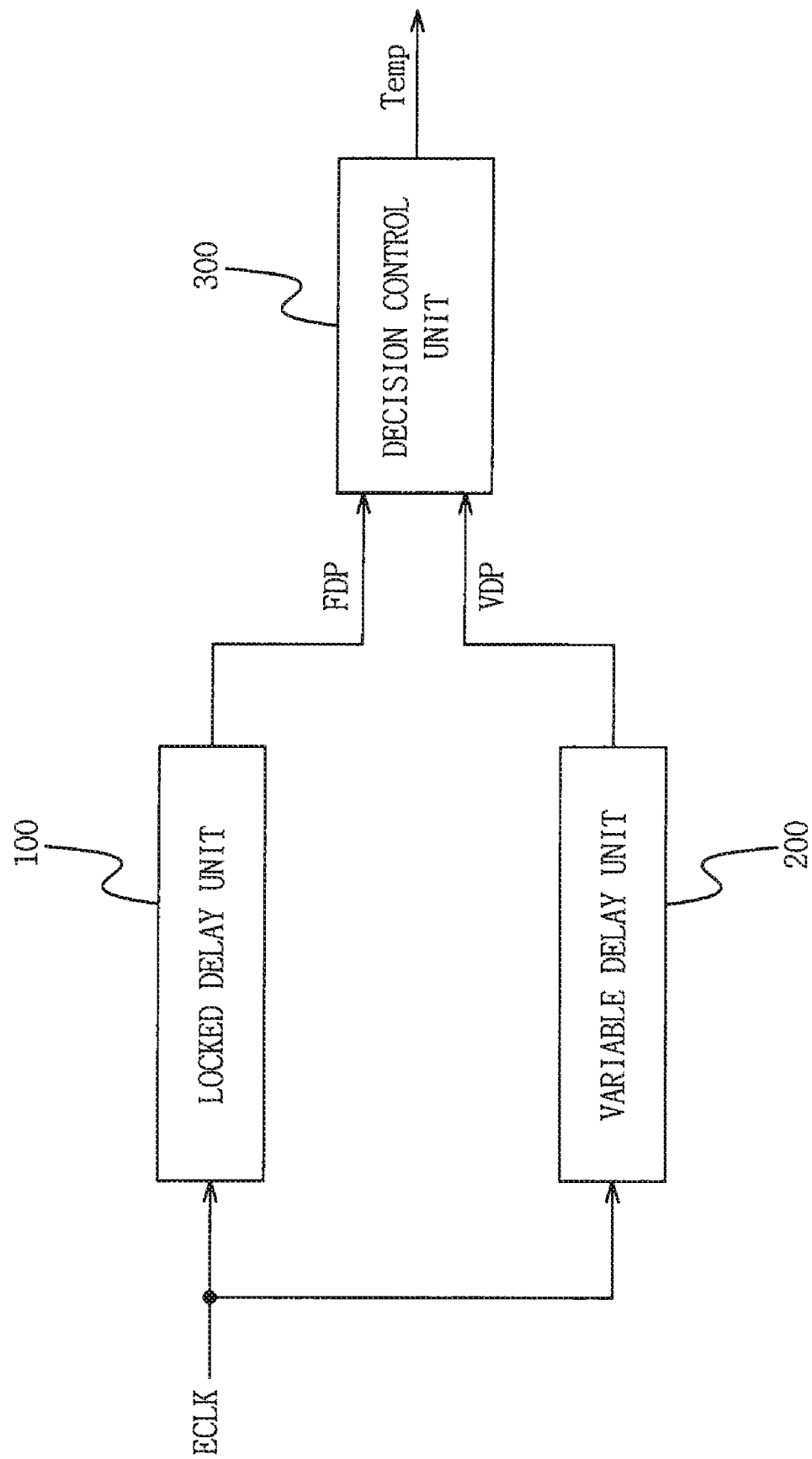
FIG. 2 is a block diagram of temperature sensing circuit according to an embodiment of the invention.

FIG. 2 is a block diagram of temperature sensing circuit according to an embodiment of the invention. Referring to FIG. 2, the temperature sensing circuit comprises a locked delay unit 100, a variable delay unit 200 and a decision control unit 300.

The locked delay unit 100 receives an external clock ECLK from the outside, and generates a delay pulse having a constant delay amount regardless of temperature, and transfers it to the decision control unit 300. The delay pulse may be defined herein as a 'locked delay pulse (FDP)'.

As described above, the locked delay unit 100 receives external clock ECLK from the outside, and outputs the locked delay pulse to the outside after a given delay. The locked delay unit 100 may comprise a delay cell of an inverter structure, but may comprise all types of delay cells having a delay amount regardless of temperature.

The variable delay unit 200 receives the external clock ECLK, and generates a plurality of delay pulses having different delay amounts changed according to a temperature change, and transfers them to the decision control unit 300. These pulses may be defined herein as a 'variable delay pulse (VDP)'. Though the variable delay unit 200 may be constructed of inverter circuits as delay cells having different delay amounts according to a temperature change, the variable delay unit 200 may be configured including all types of delay cells having different delay amounts changed corresponding to other temperature changes.

The decision control unit 300 receives the locked delay pulse FDP and the variable delay pulses VDP, and decides whether a pulse of the locked delay pulse FDP and any one of the variable delay pulses VDP are identical, and outputs a corresponding temperature signal Temp.

The temperature signal Temp is to check whether an internal temperature is higher or lower than a predetermined determination-temperature. For example, when the temperature signal has a high level, it can be decided that the internal temperature is lower than the determination temperature. Conversely, when the temperature signal has a low level, it can be decided that the internal temperature is higher than the determination temperature. The determination temperature indicates a sensing temperature to be sensed through the temperature sensing circuit. The determination temperature may be changed according to usage of the temperature sensing circuit.

The locked delay unit 100 is described more in detail, as follows.

Figure 3:
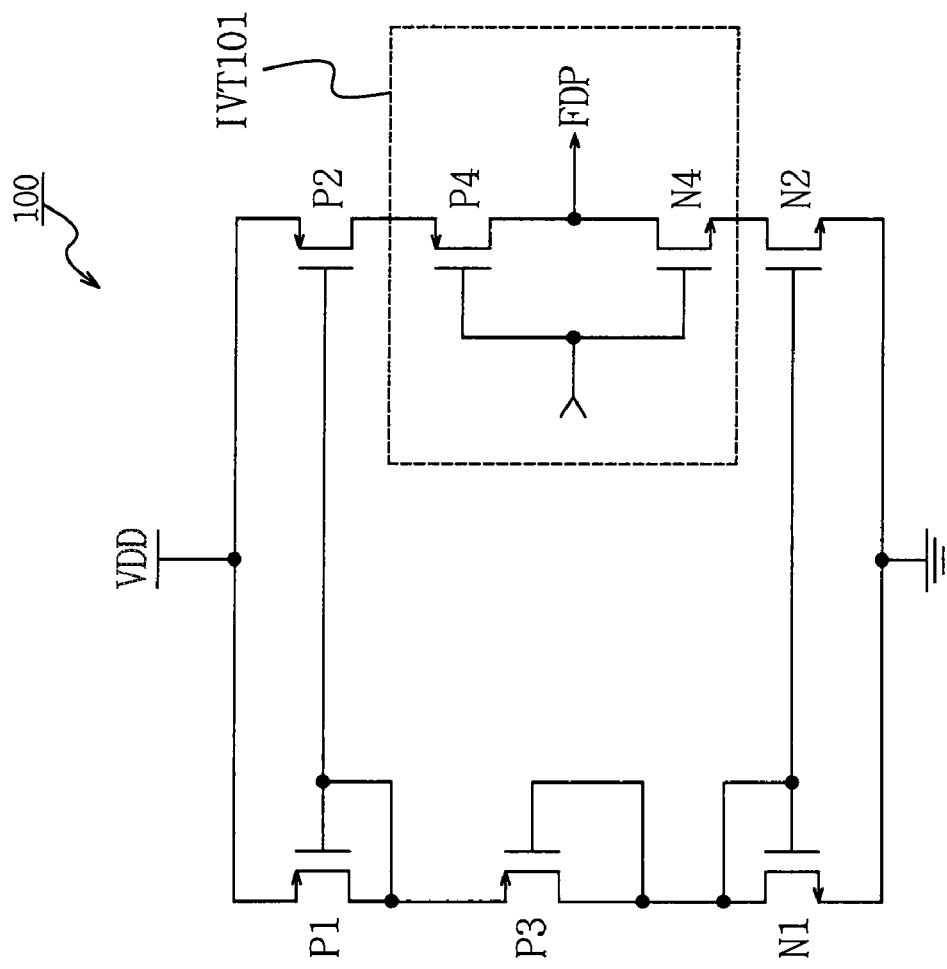
FIG. 3 illustrates an example of locked delay unit shown in FIG. 2.

FIG. 3 illustrates an example of locked delay unit 100 of FIG. 2. As shown in FIG. 3, the locked delay unit 100 may comprise PMOS transistors P1 and P3 and NMOS transistor N1 connected in series between a power voltage terminal VDD and a ground voltage terminal. Further, the locked delay unit 100 comprises PMOS transistors P2 and P4 and NMOS transistors N4 and N2, which are connected in series between the power voltage terminal VDD and the ground voltage terminal, and which have a parallel structure with the PMOS transistors P1 and P3, and the NMOS transistor N1.

The PMOS transistors P1 and P3 and the NMOS transistor N1 have a diode structure. A gate of the PMOS transistor P1 and a gate of the PMOS transistor P2 may be coupled to each other, and a gate of the NMOS transistor N1 and a gate of the NMOS transistor N2 may be coupled to each other.

The PMOS transistor P4 and the NMOS transistor N4 are provided as an inverter. The locked delay unit 100 may comprise at least one delay cell referred to in FIG. 3 so as to control a delay amount of generated locked delay pulse FDP.

Figure 4:
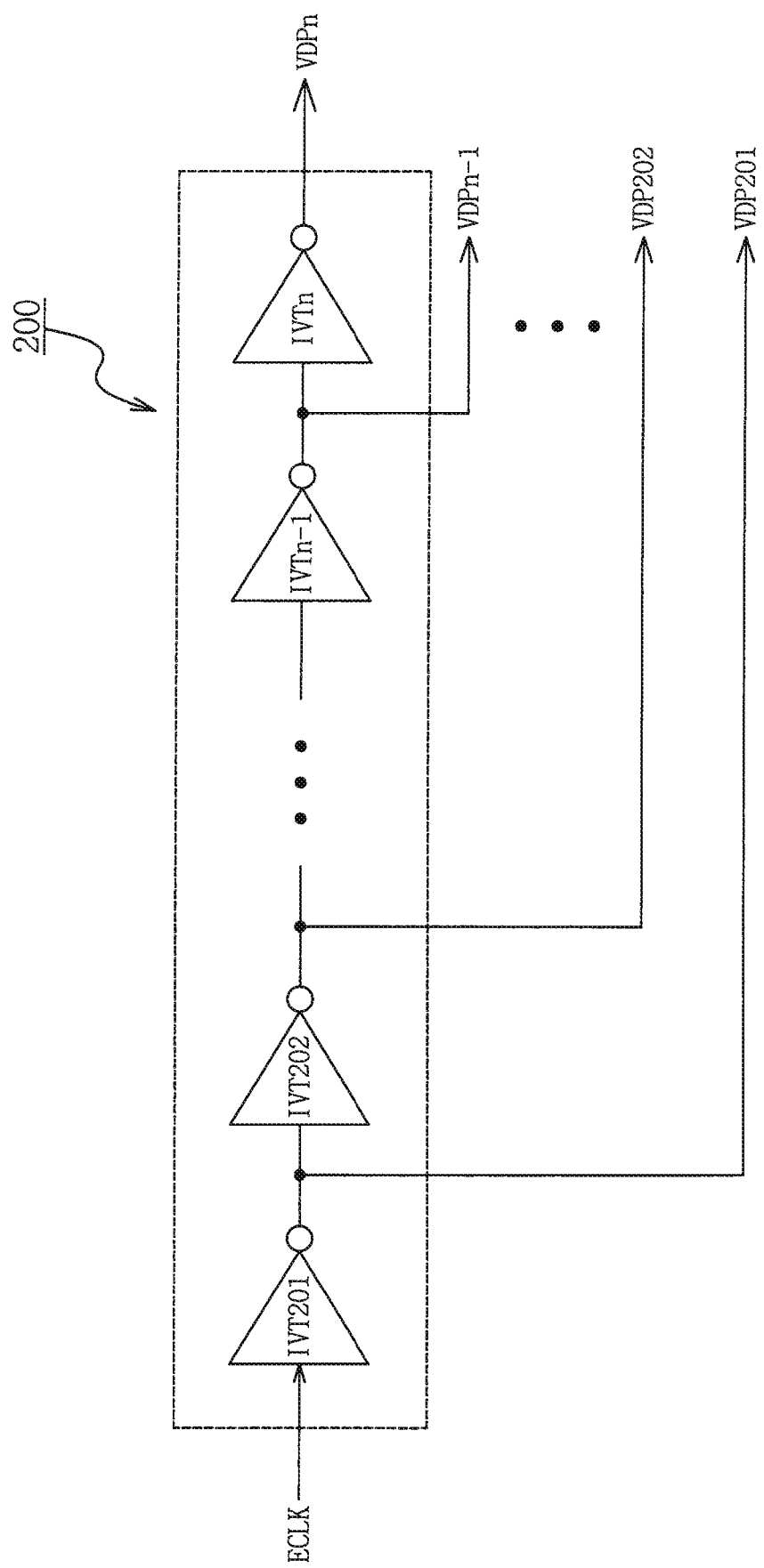
FIG. 4 illustrates an example of variable delay unit shown in FIG. 2.

FIG. 4 illustrates an example of variable delay unit 200 shown in FIG. 2. With reference to FIG. 4, the variable delay unit 200 may comprise a plurality of inverters IVT201, IVT202 ... IVTn-1 and IVTn connected in series. That is, the inverters are provided as variable delay cells, and the plurality of variable delay cells IVT201, IVT202 ... IVTn-1 and IVTn are connected in series.

A delay circuit employing an inverter chain structure that inverters IVT201, IVT202 ... IVTn-1 and IVTn are connected in series, is well known on the configuration and operation to those skilled in the field including the invention, thus a detailed description therefor is omitted herein.

The variable delay unit 200 receives the external clock ECLK, and generates a plurality of delay pulses VDP201, VDP202 ... VDPn-1 and VDPn. The variable delay unit 200 generates one variable delay pulse whenever the external clock ECLK passes through one of the variable delay cells IVT201, IVT203 ... IVTn-1 and IVTn. The generated and output variable delay pulses are defined herein 'variable delay pulses' VDP201, VDP202 ... VDPn-1 and VDPn. The variable delay pulses VDP201, VDP202 ... VDPn-1 and VDPn have mutually different delay amounts.

One variable delay pulse VDPx selected from the variable delay pulses VDP201, VDP202 ... VDPn-1 and VDPn is transferred to the decision control unit 300. A circuit to select one variable delay pulse VDPx from the variable delay pulses VDP201, VDP202 ... VDPn-1 and VDPn output from the variable delay unit 200 may be further adapted herein.

Figure 5:
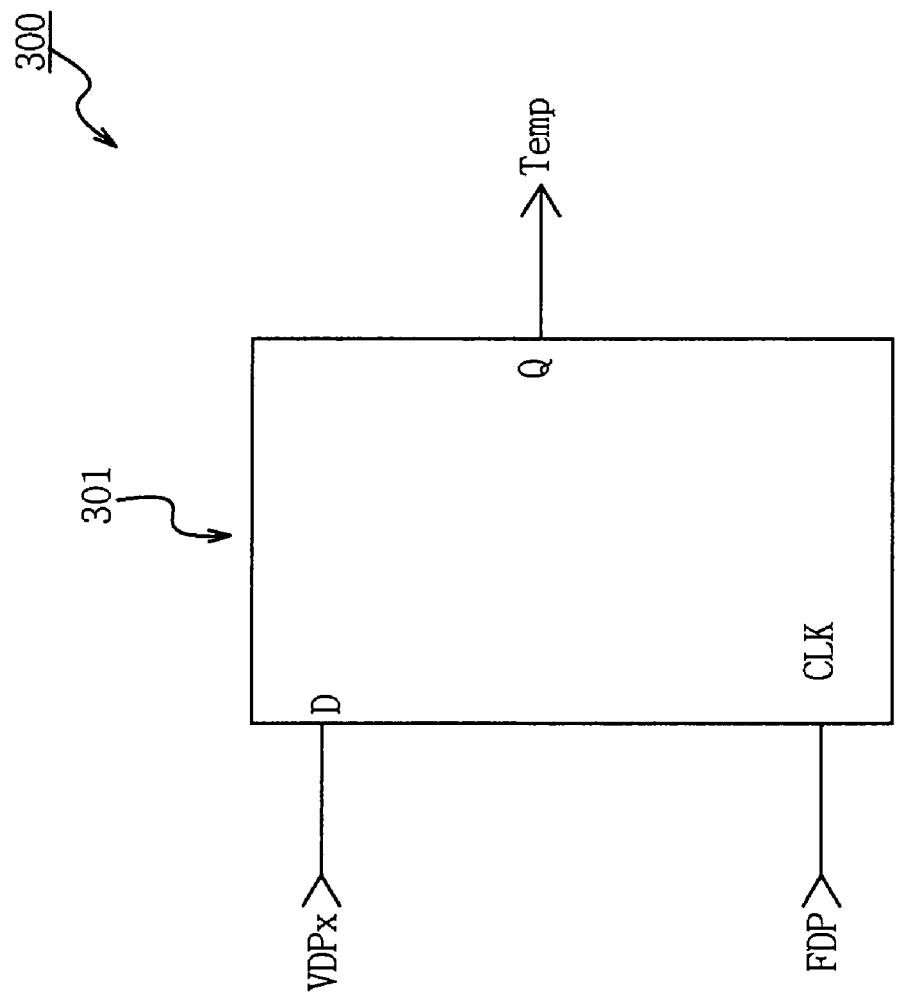
FIG. 5 illustrates an example of decision control unit shown in FIG. 2.

FIG. 5 illustrates an example of decision control unit 300 shown in FIG. 2. As shown in FIG. 5, the decision control unit 300 comprises a D flip-flop 301. The D flip-flop 301 receives the locked delay pulse FDP output from the locked delay unit 100, as a clock CLK. The D flip-flop 301 receives one variable delay pulse VDPx selected from the variable delay pulses VDP201, VDP202 ... VDPn-1 and VDPn output from the variable delay unit 200, as data, and outputs its corresponding temperature signal Temp.

In a determined temperature, the locked delay pulse FDP and any one variable delay pulse VDPx input to the decision control unit 300 synchronize to each other. Meanwhile, when temperature is changed, a delay of the locked delay pulse FDP is not changed, but a delay amount of the variable delay pulse VDPx is changed.

Accordingly, a temperature state can be recognized through a level of temperature signal Temp output from the decision control unit 300, and so a temperature compensation circuit can operate to compensate a change of the temperature based on the temperature signal Temp.

However, at this time, due to a PVT change and error of model parameter and design etc., an actual measurement of temperature may often deviate from a determination temperature targeted in designing the temperature sensing circuit. For a compensation of such temperature trip point, a calibration (hereinafter, referred to as 'compensation') operation is required. As a result, a temperature sensing circuit for the temperature compensation operation is needed.

Figure 6:
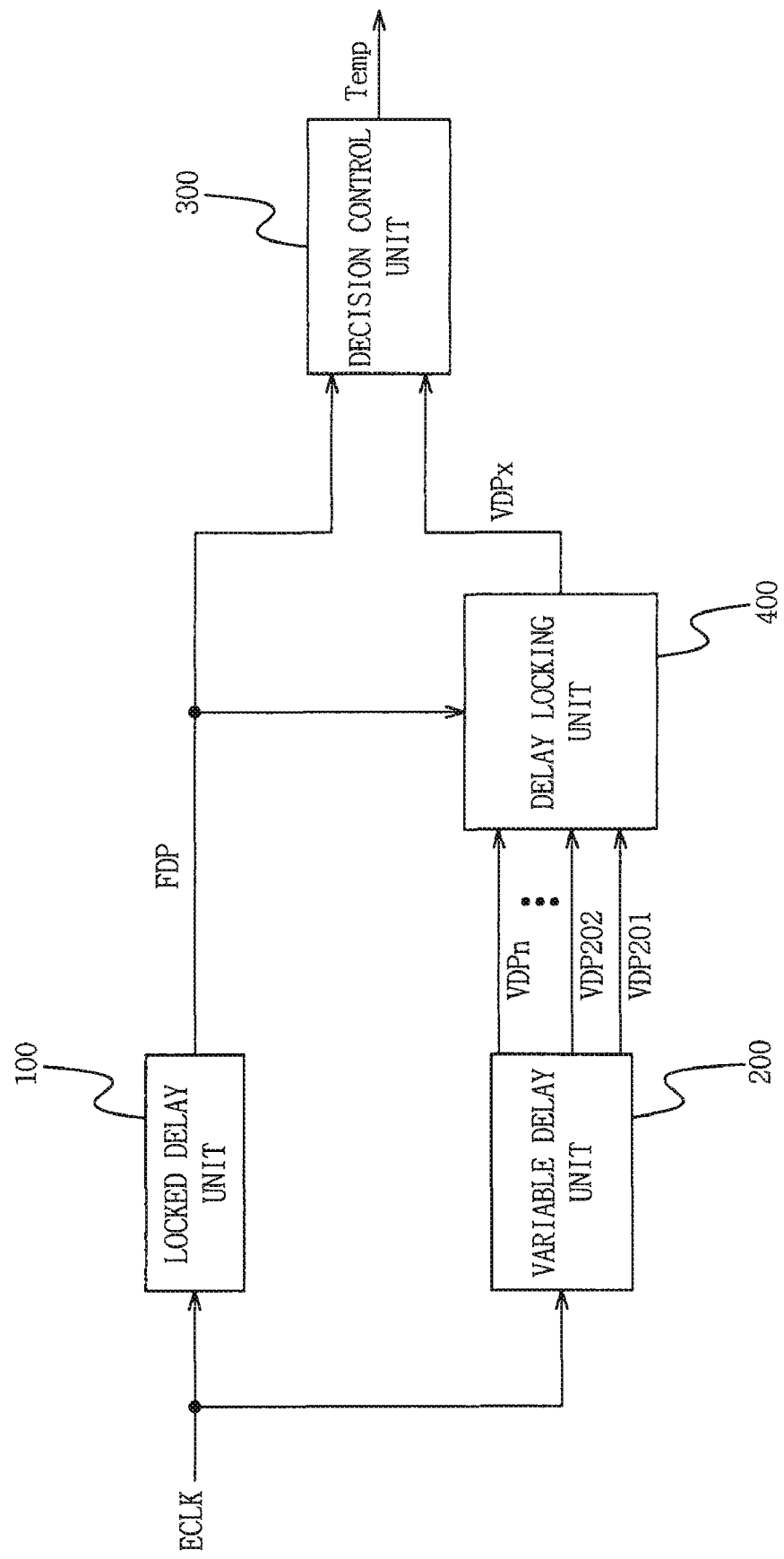
FIG. 6 is a block diagram of temperature sensing circuit according to another embodiment of the invention.

FIG. 6 is a block diagram of temperature sensing circuit according to another embodiment of the invention. Referring to FIG. 6, the temperature sensing circuit has a characteristic that a delay locking unit 400 is added to the configuration of temperature sensing circuit shown in FIG. 2. The locked delay unit 100, variable delay unit 200, and decision control unit 300 are the same as the description of FIG. 5; thus their description is omitted in FIG. 6.

The delay locking unit 400 is adapted between the variable delay unit 200 and the decision control unit 300. The delay locking unit 400 selects one optional variable delay pulse VDPx from a plurality of delay pulses VDP201, VDP202 ... VDPn-1 and VDPn output through the variable delay unit 200, then outputs the selected variable delay pulse VDPx to the decision control unit 300.

For example, under a determination temperature, the delay locking unit 400 selects one variable delay pulse VDPx that synchronizes to the locked delay pulse FDP, from the variable delay pulses VDP201, VDP202 ... VDPn-1 and VDPn input from the variable delay unit 200. The delay locking unit 400 may operate only in the temperature compensation. And when the temperature compensation operation is completed, the delay locking unit 400 may perform only an operation of locking and outputting a currently selected variable delay pulse VDPx; and in other cases, may not operate.

The delay locking unit 400 is described more in detail, as follows.

Figure 7:
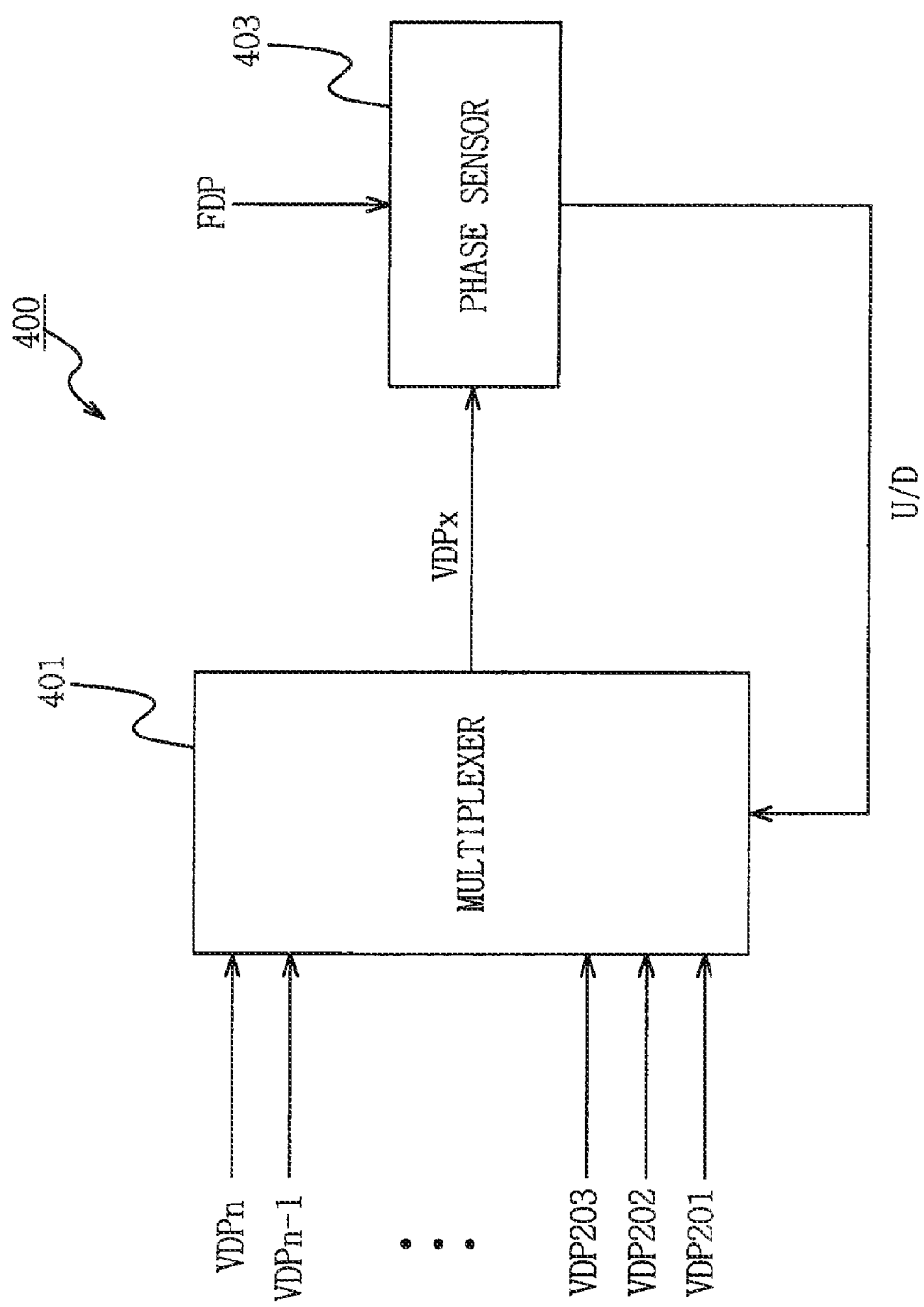
FIG. 7 depicts an example of delay locking unit illustrated in FIG. 6.

FIG. 7 depicts an example of delay locking unit illustrated in FIG. 6. As shown in FIG. 7, the delay locking unit 400 comprises a multiplexer 401 and a phase sensor 403. The multiplexer 401 is adapted between the variable delay unit 200 and the phase sensor 403, and selects one VDPx of a plurality of variable delay pulses VDP201, VDP202 . . . VDPn-1 and VDPn, and outputs it to the phase sensor 403.

The phase sensor 403 compares the variable delay pulse VDPx output from the multiplexer 401 with a phase of the locked delay pulse FDP, and outputs a corresponding comparison signal U/D. The multiplexer 401 reselects a variable delay pulse different from the variable delay pulse VDPx from the plurality delay pulses VDP201, VDP202 . . . VDPn-1 and VDPn, in response to the comparison signal U/D, and outputs it to the phase sensor 403.

Then, the phase comparison operation described above repetitively continues until phases of the variable delay pulse VDPx and the locked delay pulse FDP become identical. For example, the multiplexer receives the variable delay pulses VDP201, VDP202 . . . VDPn-1 and VDPn output from the variable delay unit 200, selects one variable delay pulse VDP202 therefrom, and transfers it to the phase sensor 403.

The phase sensor 403 that received the variable delay pulse VDP202, also receives the locked delay pulse FDP from the locked delay unit 100, and then compares phases of the variable delay pulse VDP202 and the locked delay pulse FDP.

When comparing the phases, if the phase of the variable delay pulse VDPx is faster or slower than the phase of the locked delay pulse FDP, then the phase sensor 403 generates an up/down signal U/D as a phase comparison signal, and transfers it to the multiplexer 401.

For example, when an up signal U is output from the phase sensor 403, it may indicate the phase of the variable delay pulse VDPx is faster than the locked delay pulse FDP. Thus, the multiplexer 401 reselects another variable selection delay pulse VDP203 that has a delay amount more than the previously selected variable delay pulse VDP202, from the plural variable delay pulses VDP201, VDP202 . . . VDPn-1 and VDPn, in response to the up signal U.

Conversely, when a down signal D is generated from the phase sensor 403, it may indicate a phase of the variable delay pulse VDP202 is slower than the locked delay pulse FDP. Thus, the multiplexer 401 selects another variable selection delay pulse VDP201 that has a delay amount less than the previously selected variable selection delay pulse VDP202, from the plural variable delay pulses VDP201, VDP202 . . . VDPn-1 and VDPn. Then, the multiplexer 401 again transfers the reselected variable selection delay pulse VDPx to the phase sensor 403.

The selection operation for the variable selection delay pulse VDPx of the multiplexer 401 repetitively continues until the phases of the variable selection delay pulse VDPx and the locked delay pulse FDP are locked in the phase sensor 403.

However, when the up signal U is output from the phase sensor 403, it may indicate the phase of the variable selection delay pulse VDPx is slower than the locked delay pulse FDP. Thus, the multiplexer 401 may reselect another variable selection delay pulse VDP201 that has a delay amount less than the previously selected variable selection delay pulse VDP202, from the plural variable delay pulses VDP201, VDP202 . . . VDPn-1 and VDPn, in response to the up signal U.

Conversely, when the down signal D is generated from the phase sensor 403, it may indicate that a phase of the variable selection delay pulse VDP202 is faster than the locked delay pulse FDP. Thus, the multiplexer 401 may reselect another variable selection delay pulse VDP203 that has a delay amount more than the previously selected variable selection delay pulse VDP202, from the plurality of variable delay pulses VDP201, VDP202 . . . VDPn-1 and VDPn. The multiplexer 401 may additionally use a counter in selecting the variable selection delay pulse VDPx.

Figure 8:
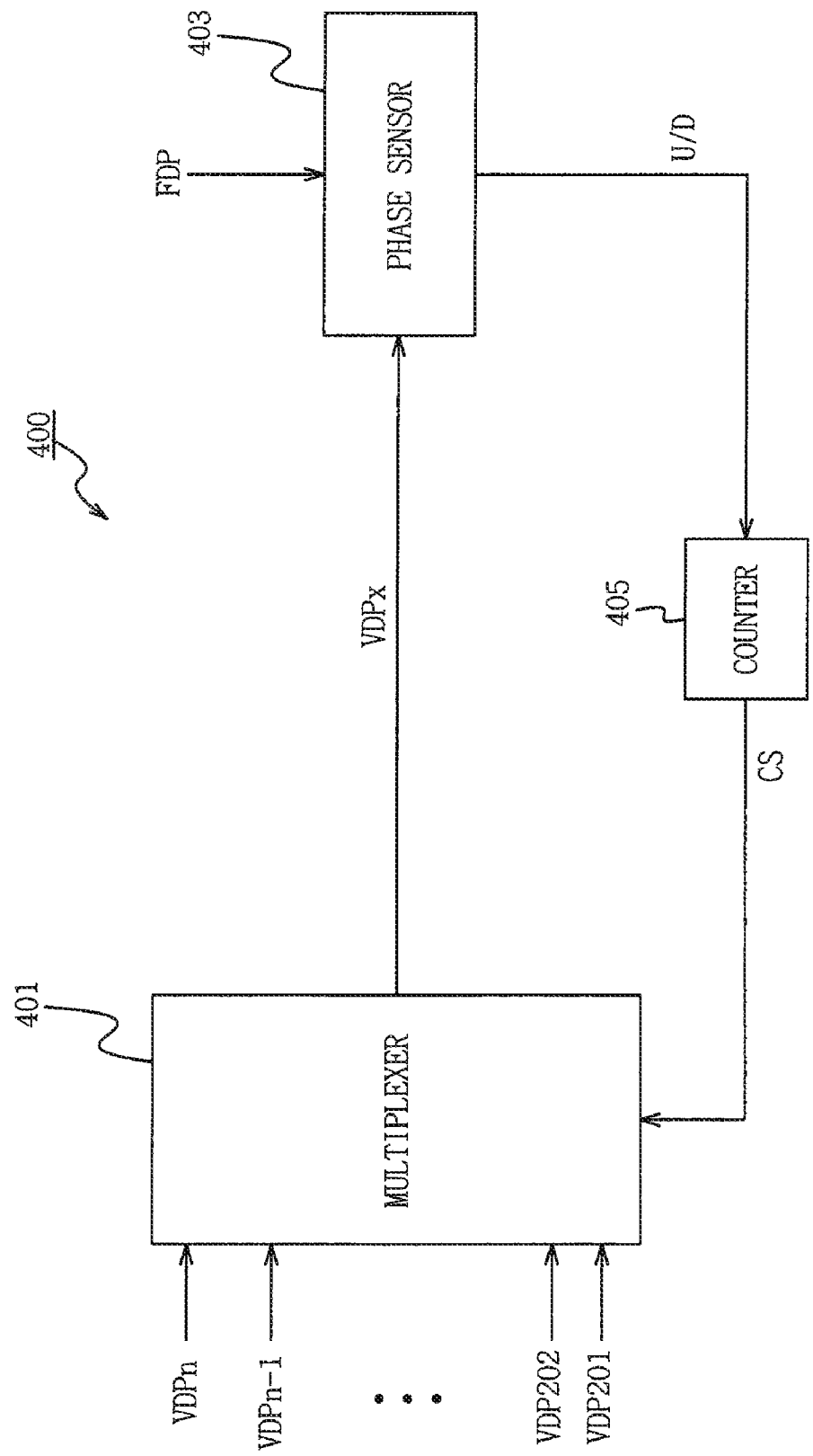
FIG. 8 depicts another example of delay locking unit illustrated in FIG. 6.

FIG. 8 depicts another example embodiment of delay locking unit 400 illustrated in FIG. 6. As show in FIG. 8, the delay locking unit 400 has a structure in which a counter is added to the configuration of FIG. 7.

The multiplexer 401 is configured between the variable delay unit 200 and the phase sensor 403, and selects one VDPx of the plurality of variable delay pulses VDP201, VDP202 . . . VDPn-1 and VDPn, and outputs it to the phase sensor 403. The phase sensor 403 compares variable delay pulse VDPx output from the multiplexer 401 with a phase of the locked delay pulse FDP, and outputs a corresponding comparison signal, up/down signal U/D.

The counter 405 generates a count signal CS for a reselection of variable delay pulse in response to the up/down signal, then transfers it to the multiplexer 401. For example, the multiplexer 401 receives the variable delay pulses VDP201, VDP202 . . . VDPn-1 and VDPn output from the variable delay unit 200, selects one variable delay pulse VDP202 therefrom, and transfers it to the phase sensor 403.

The phase sensor 403 that received the variable delay pulse VDP202, also receives the locked delay pulse FDP from the locked delay unit 100, and then compares phases of the variable delay pulse VDP202 and the locked delay pulse FDP. For example, when an up signal U is output from the phase sensor 403, it may indicate a phase of the variable selection delay pulse VDP202 is faster than the locked delay pulse FDP.

The counter 405 generates an increased count signal CS to reselect another variable selection delay pulse VDP203 that has a delay amount more than the variable selection delay pulse VDP202, from the plurality of variable delay pulses VDP201, VDP202 . . . VDPn-1 and VDPn in response to the up signal U, and transfers it to the multiplexer 401. Conversely, when a down signal D is generated from the phase sensor 403, it may indicate that a phase of the variable selection delay pulse VDP202 is slower than the locked delay pulse FDP.

The counter 405 generates a decreased count signal CS to reselect other variable selection delay pulse VDP201 that has a delay amount less than the variable selection delay pulse VDP202, from the plural variable delay pulses VDP201, VDP202 . . . VDPn-1 and VDPn, and transfers it to the multiplexer 401. To the contrary, when the up signal U is generated from the phase sensor 403, the counter 405 may generate a decreased count signal CS to select a variable selection delay pulse VDPx having more of a delay amount from the variable delay pulses VDP201, VDP202 . . . VDPn-1 and VDPn.

Further, when the down signal D is generated from the phase sensor 403, the counter 405 may generate an increased count signal CS to select a variable selection delay pulse VDPx having less of a delay amount from the variable delay pulses VDP201, VDP202 . . . VDPn-1 and VDPn.

The multiplexer 401 reselects variable selection delay pulse VCPx from the plurality of delay pulses VDP201, VDP202 . . . VDPn-1 and VDPn in response to the count signal CS. For example, when the multiplexer 401 receives the increased count signal CS, the multiplexer 401 may select a variable delay pulse VDP203 corresponding to a next turn to a currently selected variable selection delay pulse VDP202, so as to select variable selection delay pulse having a delay amount more than the currently selected variable selection delay pulse VDP202. Or, the multiplexer 401 may select other variable delay pulse VDP201.

For example, when the multiplexer 401 receives the decreased count signal CS, the multiplexer 401 selects a variable delay pulse VDP201 corresponding to a prior turn to a currently selected variable selection delay pulse VDP202, so as to select a variable selection delay pulse having a delay amount less than the currently selected variable selection delay pulse VDP202. Or, the multiplexer 401 may select another variable delay pulse VDP203.

The selection operation for the variable selection delay pulse VDPx of the multiplexer 401 repetitively continues until the phases of the variable selection delay pulse VDPx and the locked delay pulse FDP are locked in the phase sensor 403.

Figure 9:
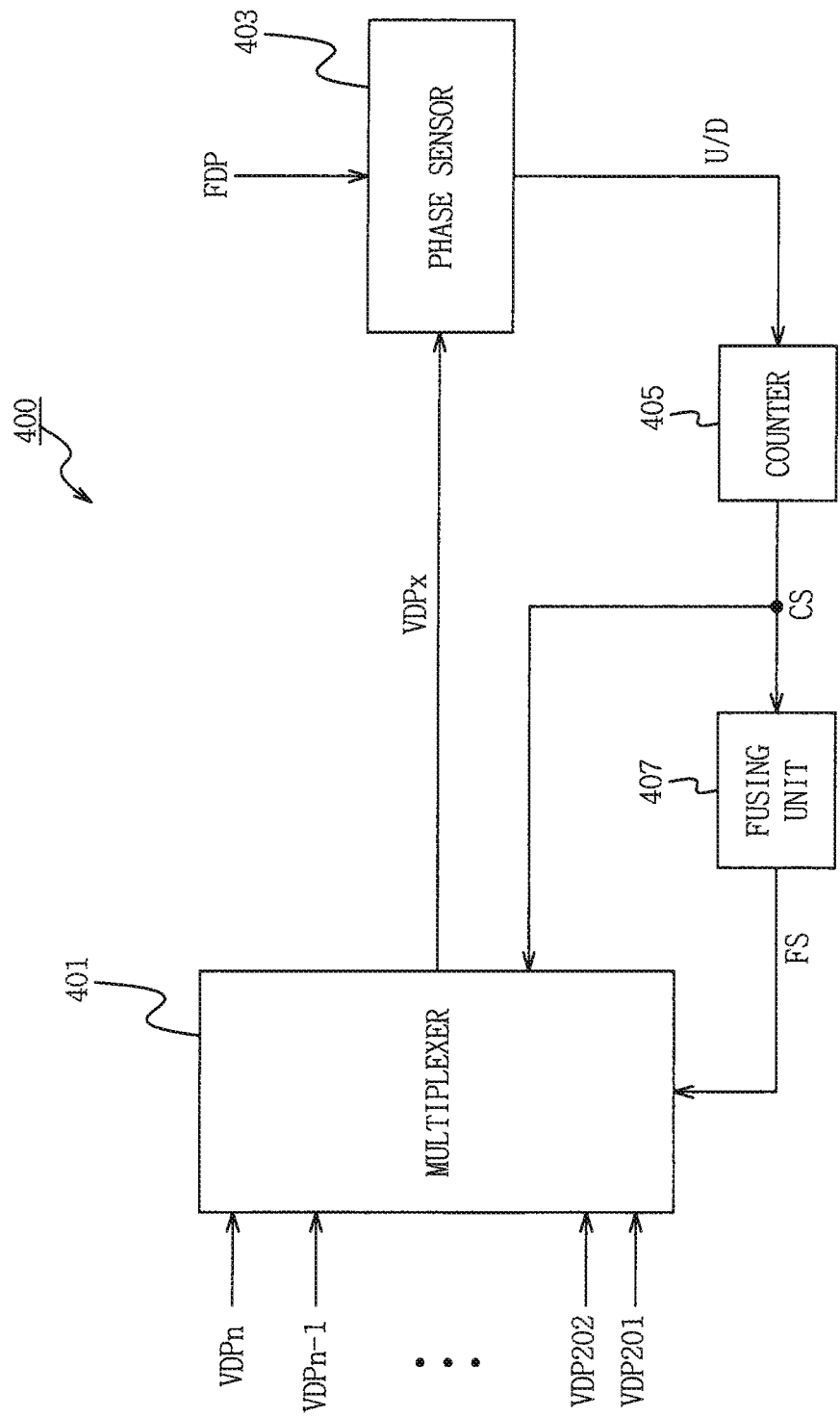
FIG. 9 depicts another example of delay locking unit illustrated in FIG. 6.

FIG. 9 depicts another example of the delay locking unit 400 illustrated in FIG. 6. As shown in FIG. 9, the delay locking unit 400 has a structure in which a fusing unit 407 is added to the configuration of FIG. 8.

The multiplexer 401, phase sensor 403 and counter 405 are the same as the description for the operation and configuration of FIG. 8; thus a description therefor is omitted.

First, an operation like that described with respect to FIG. 8 is performed herein. Then, when phases of the variable selection delay pulse VDPx and the locked delay pulse FDP are identical, the counter 405 transfers the count signal CS to the fusing unit 407. The fusing unit 407 receives the locked count signal CS from the counter 405, performs a fusing operation, generates a fusing signal FS, and transfers it to the multiplexer 401. The fusing unit may be an electrical fusing unit, and may automatically operate during or after a locking operation.

The multiplexer 401 receives the fusing signal FS from the fusing unit 407, and then a locked output of the currently outputted variable selection delay pulse VDPx continues without performing a selection operation of variable delay pulse. Consequently, the selection operation of variable delay pulse through the delay locking unit 400 is completed.

Figure 10:
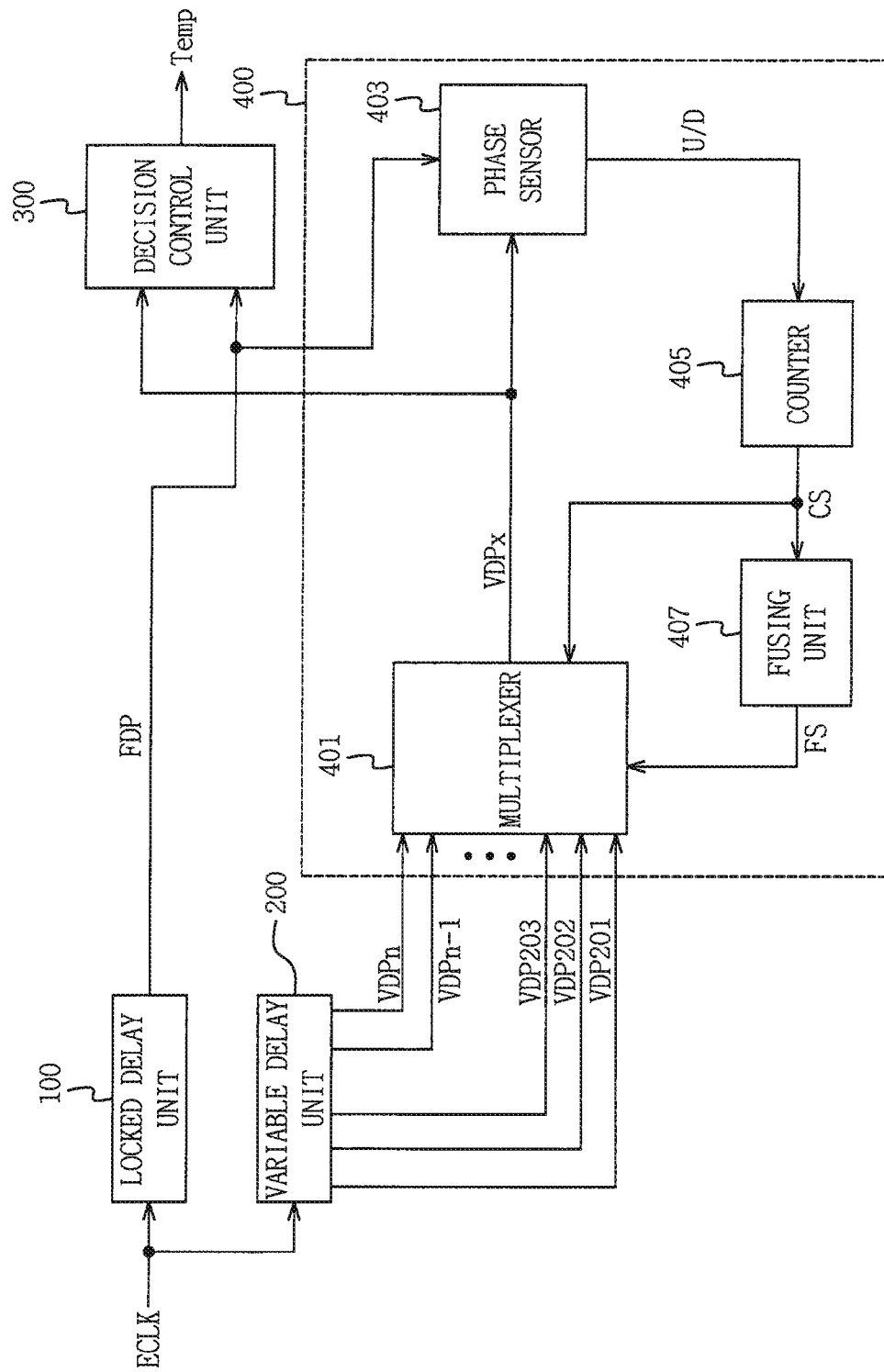
FIG. 10 illustrates another embodiment of the invention.

FIG. 10 is a block diagram illustrating in detail the temperature sensing circuit of FIG. 6, employing the delay locking unit 400 of FIG. 9. The respective components of FIG. 10 were described above referring to FIGS. 6 to FIG. 9, thus a repetitive description is omitted in FIG. 10, and only an entire operation is described as follows. The entire operation is largely classified as a compensation operating mode and a temperature sense operating mode. The compensation operating mode is to compensate a determination temperature to get a sensing operation, and the temperature sense operating mode indicates a mode in a generally well-known temperature sensing circuit.

In the compensation operation mode, locked delay unit 100, variable delay unit 200 and delay locking unit 400 operate. The temperature sensing circuit operates in a specific determination temperature state necessary for a temperature sensing operation. For example, a locked delay pulse having a constant delay amount regardless of temperature is output from the locked delay unit 100, and a plurality of variable delay pulses having a delay amount changed depending upon temperature are output from the variable delay unit.

One variable delay pulse, e.g., VDP202, of the plurality of variable delay pulses VDP201, VDP202, VDP203 . . . VDPn-1 and VDPn is selected. Phases of the variable selection delay pulse VDP202 and the locked delay pulse FDP are compared, and an up/down signal U/D as a phase comparison signal is generated. At this time, when a phase of the variable selection pulse VDP202 is faster than the locked delay pulse FDP, an up signal U may be generated.

In response to the up signal U, an increased count signal CS is generated and so a variable selection delay pulse VDP203 of a next turn having a delay amount more than the variable selection delay pulse VDP202 may be selected from the plurality of variable selection delay pulses VDP201, VDP202, VDP203 . . . VDPn-1 and VDPn. When the phase of the variable selection delay pulse VDP202 is slower than the locked delay pulse FDP, a down signal D may be generated.

In response to the down signal D, a decreased count signal CS is generated and so a variable selection delay pulse VDP201 of a previous turn having a delay amount less than the variable selection delay pulse VDP202 may be selected from the plurality of variable selection delay pulses VDP201, VDP202, VDP203 . . . VDPn-1 and VDPn.

Or, when a phase of the variable selection delay pulse VDP202 is slower than the locked delay pulse FDP, an up signal U may be generated. A phase comparison between the variable selection delay pulse VDPx reselected in response to the up/down signal U/D and the locked delay pulse FDP is again performed. The phase comparison operation is repetitively performed until phases of the variable selection delay pulse VDPx and the locked delay pulse FDP become identical.

Consequently, the execution of compensation operating mode is completed. Temperature sense operating mode is to sense internal temperature of a device employing the temperature sensing circuit after a completion of the compensation operating mode. The temperature sense operating mode is to sense an internal temperature of the device employing the temperature sensing circuit through the phase comparison between the locked delay pulse FDP and a variable delay pulse locked in the compensation operating mode.

That is, when external clock ECLK is input, the external clock ECLK is received, and a locked delay pulse FDP having a constant delay amount regardless of temperature and a variable selection delay pulse VDPx selected by the compensation operation from plurality of variable delay pulses VDP201, VDP202, VDP203 . . . VDPn-1 and VDPn, are input to the decision control unit 300. As already described above, the variable selection delay pulse VDPx is a delay pulse having a delay amount changed according to a temperature change.

The temperature sensing operation is performed at a rising edge of the locked delay pulse FD, corresponding to a state of the variable selection delay pulse VDPx. For example, when the state of the variable selection delay pulse VDPx has a high level at a rising edge of the locked delay pulse FDP, a temperature signal Temp of high level is produced. This may indicate a measurement temperature has a low state as compared with a determination temperature.

To the contrary, when the state of the variable selection delay pulse VDPx has a low level at a rising edge of the locked delay pulse FDP, a temperature signal Temp of low level is produced. This may indicate a measurement temperature has a high state as compared with a determination temperature. For example, when the determination temperatures to be measured are more than one, a plurality of determination temperatures may be measured through the temperature sensing circuit.

Figure 11:
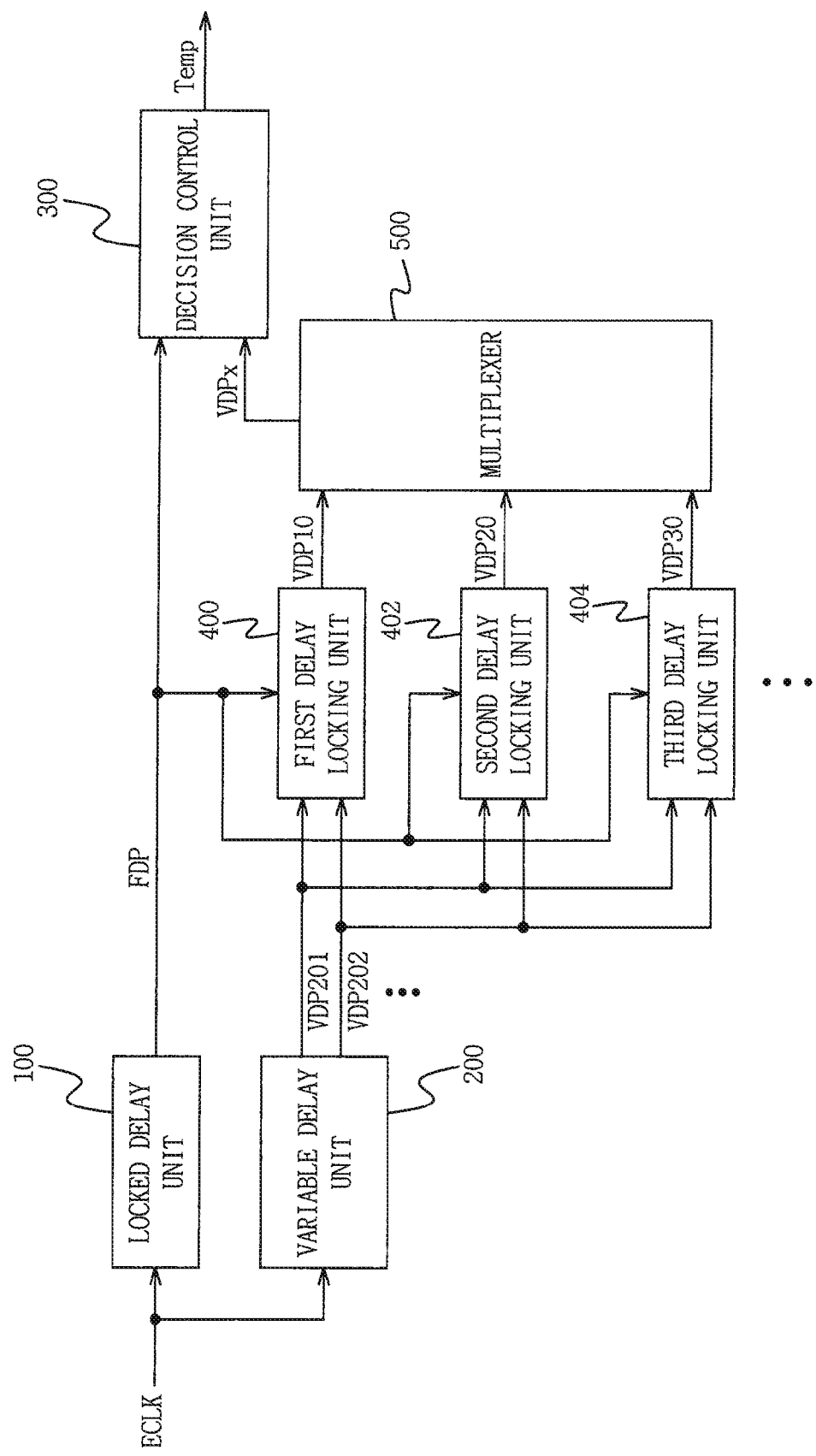
FIG. 11 is a block diagram of temperature sensing circuit according to another embodiment of the invention.

FIG. 11 is a block diagram of temperature sensing circuit according to another embodiment of the invention. With reference to FIG. 11, the temperature sensing circuit has a similar structure to the delay locking unit referred to in FIG. 6 or 10, and is adapted with a plural parallel connection one with another. The plurality of delay locking units 400, 402, 404 . . . may be used corresponding to the number of temperatures Temp to be sensed by the temperature sensing circuit. The temperature sensing circuit may further comprise a multiplexer 500 for a signal multiplexing between the delay locking units 400, 402, 404 . . . and the decision control unit 300.

Respective operation for the delay locking units 400, 402, 404 . . . has been described above with reference to FIGS. 7-9, thus the repetitive description is omitted herein, and an entire operation therefor is described in brief, as follows. It is described herein with an example that the temperature sensing circuit employs first to third delay locking units 400, 402 and 404 having each of three determination temperatures of first temperature 30° C., second temperature 40° C. and third temperature 50° C.

In a determination temperature state of compensation operating mode, an operation to lock a variable delay pulse synchronizing to the locked delay pulse FDP among a plurality of variable delay pulses VDP201, VDP202, VDP203 . . . VDPn-1 and VDPn is performed. That is, temperature Temp to be sensed is determined in the respective delay locking unit 400, 402, 404 . . . . The temperature sensing circuit operates in the first temperature 30° C. A first variable delay pulse VDP10 is locked through compensation operation of the first delay locking unit 400 described with reference to FIG. 10. Then, in the second temperature 40° C., a second variable delay pulse VDP20 is locked through operation of the second delay locking unit 402. And, in the third temperature 50° C., a third variable delay pulse VDP30 is locked through operation of the third delay locking unit 404. 30° C. in the first delay locking unit 400, 40° C. in the second delay locking unit 402 and 50° C. in the third delay locking unit 404 may be each determined as a determination temperature.

Subsequent temperature sensing operation is described as follows. To sense the temperature of 30° C., the first delay locking unit 400 and the decision control unit 300 are connected through a selection operation of the multiplexer 500. The decision control unit 300 senses an internal temperature through a phase comparison of the first variable delay pulse VDP10 and the locked delay pulse FDP. A temperature signal Temp based on a state of the locked delay pulse FDP and the first variable delay pulse VDP10 is output, thereby performing a temperature sensing operation of the temperature sensing circuit.

To sense the temperature of 40° C., the second delay locking unit 402 and the decision control unit 300 are connected through a selection operation of the multiplexer 500. The decision control unit 300 senses an internal temperature through a phase comparison of the second variable delay pulse VDP20 and the locked delay pulse FDP. A temperature signal Temp based on a state of the locked delay pulse FDP and the second variable delay pulse VDP20 is output, thereby performing a temperature sensing operation of the temperature sensing circuit.

To sense the temperature of 50° C., the third delay locking unit 404 and the decision control unit 300 are connected through a selection operation of the multiplexer 500. The decision control unit 300 senses an internal temperature through a phase comparison of the third variable delay pulse VDP30 and the locked delay pulse FDP. A temperature signal Temp based on a state of the locked delay pulse FDP and the third variable delay pulse VDP30 is output, thereby performing a temperature sensing operation of the temperature sensing circuit.

In this case, there is a difficulty to have to perform a multiplexing operation several times when not knowing a temperature range to be measured; that is, it is difficult to immediately know a measurement temperature, but there is an advantage of using a wide range in mutually different devices having a different determination temperature. For example, embodiments of the present invention can be used in a device having a determination temperature of 30° C., and also in a device having a determination temperature of 40° C.

Figure 12:
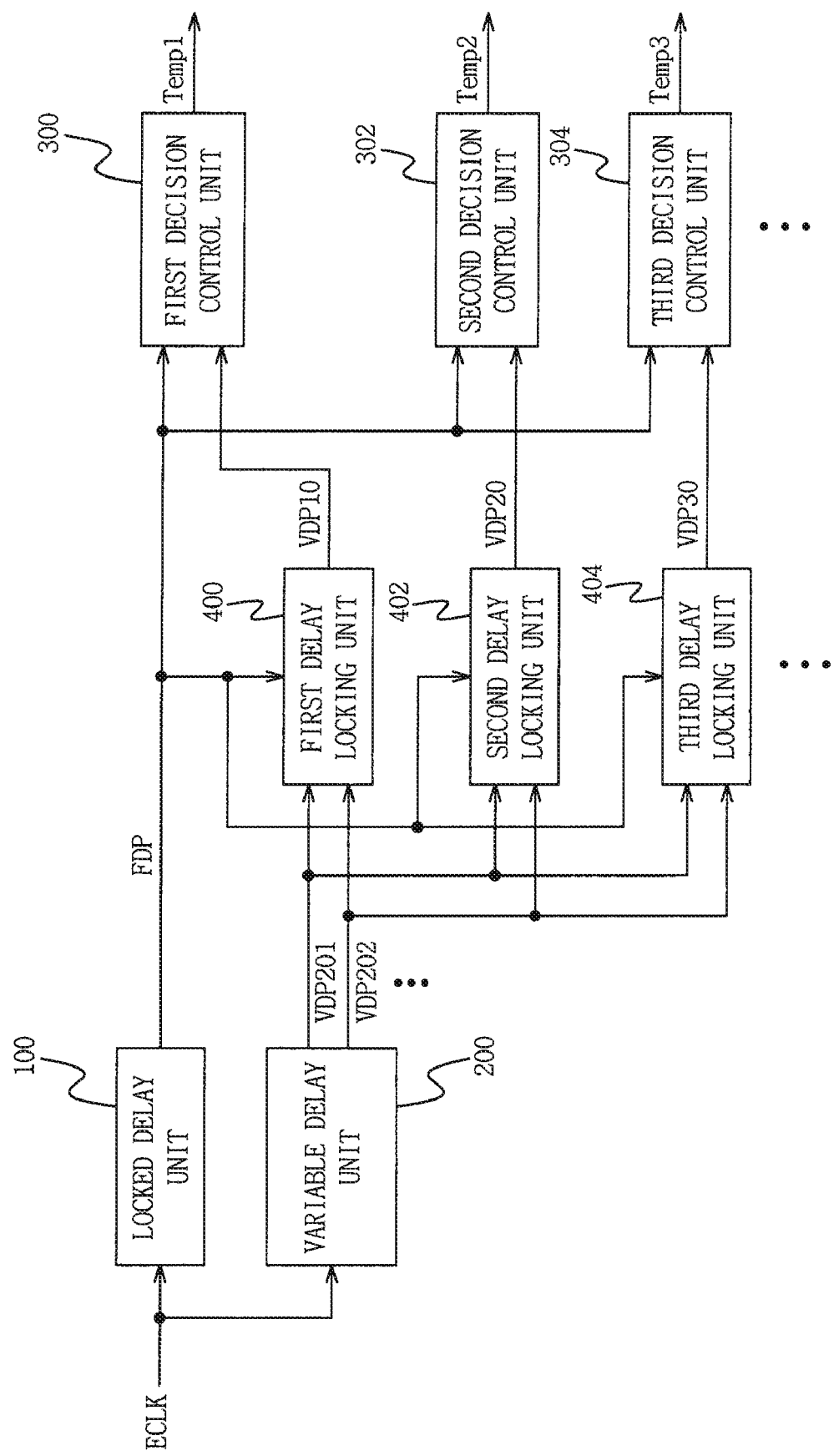
FIG. 12 is a block diagram of temperature sensing circuit according to another embodiment of the invention.

FIG. 12 is a block diagram of temperature sensing circuit according to another embodiment of the invention. As shown in FIG. 12, the temperature sensing circuit further comprises the decision control units, corresponding to the number of the delay locking units 400, 402, 404 . . . referred to in FIG. 11. At this time, the multiplexer 500 may not be needed.

As a first example, the temperature sensing circuit comprises a first decision control unit 300, second decision control unit 302, and third decision control unit 304.

The first decision control unit 300 compares a phase of first variable selection delay pulse VDP10 of the first delay locking unit 400 with a phase of locked delay pulse FDP, and outputs a first temperature signal Temp1.

The second decision control unit 302 compares a phase of second variable selection delay pulse VDP20 of the second delay locking unit 402 with a phase of locked delay pulse FDP, and outputs a second temperature signal Temp2.

The third decision control unit 304 compares a phase of third variable selection delay pulse VDP30 of the third delay locking unit 404 with a phase of locked delay pulse FDP, and outputs a third temperature signal Temp3.

A compensation operation is the same as the description of FIG. 11.

Then, a temperature sensing operation can be simpler as compared with FIG. 11. A multiplexing operation of the multiplexer 500, e.g., like in FIG. 11, is unnecessary; thus a sensing operation can become simple. In other words, a plurality of temperatures signals Temp1, Temp2 and Temp3 corresponding to the measurement temperature are simultaneously output through the plurality of decision control units 300, 302 and 304; thus, an internal temperature can be measured more precisely.

For example, when the first temperature signal Temp1 has a high level and the second and third temperature signals Temp2 and Temp3 have a low level, it can be recognized that the internal temperature is a temperature between the first and second temperature signals Temp1 and Temp2. Or, when the first and second temperatures Temp1 and Temp2 have a low level, and the third temperature signal Temp3 has a high level, the internal temperature is a temperature between the second temperature signal Temp2 and the third temperature signal Temp3.

In other temperature signals, the internal temperature can also be detected through such decision operation. As a result, as described above, an internal temperature can be measured more precisely in a temperature sensing circuit employing a plurality of delay locking units as compared with a temperature sensing circuit employing one delay locking unit.

An example of applying the temperature sensing circuit to a refresh period control circuit is described as follows. In the refresh period control circuit, when an internal temperature of a semiconductor memory device employing the refresh period control unit is under a first determination temperature, a refresh period of the semiconductor memory device may be determined as 3T, and a refresh period may be determined as 2T when the internal temperature is between a first determination temperature and a second determination temperature. Further, when the internal temperature is between second and third determination temperatures, it may be determined as T, and when the internal temperature is more than the third determination temperature, the refresh period may be determined as ½T. This refresh period may be varied by a user and so the invention is not limited to such range.

The temperature sensing circuit can be applied to all kinds of devices and circuits performing a specific operation depending upon temperature, including a refresh period control circuit. As described above, according to some embodiments of the invention, consumption of time and cost based on a temperature compensation can be reduced by employing a delay locking unit in a temperature sensing circuit, with an automatic compensation and precise temperature sense.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A temperature sensing compensation circuit using a delay locked loop, the circuit comprising:
    a locked delay unit configured to generate a locked delay pulse having a constant delay regardless of temperature;
    a variable delay unit having a plurality of delay cells, the variable delay unit being configured to receive an external clock and to generate a plurality of variable delay pulses having different delays based on temperature;
    a delay locking unit configured to repetitively select one variable delay pulse from the variable delay pulses to lock the locked delay pulse to the variable delay pulse; and
    a decision control unit configured to sense a determination temperature by using a phase difference between the selected variable delay pulse and the locked delay pulse.

2. The circuit of claim 1, wherein the decision control unit comprises a D flip-flop configured to receive the locked delay pulse as a reference clock, to receive the one selected variable delay pulse as data, and to externally output a corresponding delay pulse.

3. The circuit of claim 1, wherein the delay locking unit comprises:
    a phase sensor configured to repetitively compare a phase of one of the variable delay pulses with a phase of the locked delay pulse and to generate a corresponding comparison signal; and
    a multiplexer configured to repetitively select the one variable delay pulse corresponding to the comparison signal of the phase sensor, from the variable delay pulses, and to output the selected pulse to the phase sensor.

4. The circuit of claim 3, wherein the delay locking unit further comprises a counter configured to generate a count signal to provide a selection reference of variable delay pulse in the multiplexer responsive to the comparison signal output from the phase sensor.

5. The circuit of claim 3, wherein the delay locking unit further comprises a fusing unit configured to perform a fusing operation so that a variable delay pulse is selected during or after locking of a delay in the delay locking unit, and is output to the decision control unit through the multiplexer.

6. The circuit of claim 5, wherein the fusing operation is automatically operating during or after locking.

7. The circuit of claim 5, wherein the fusing unit is an electrical fusing unit.

8. The circuit of claim 1, wherein when the determination temperatures to be sensed includes a plurality of determination temperatures, the delay locking unit includes a plurality of delay locking units corresponding to the number of determination temperatures.

9. A temperature sensing compensation method using a delay locked loop, the method comprising:
    (a) determining at least one determination temperature;
    (b) receiving an external clock input;
    (c) generating a locked delay pulse having a locked delay regardless of temperature;
    (d) generating a plurality of variable delay pulses having different delays according to temperature;
    (e) selecting one of the plurality of variable delay pulses;
    (f) comparing a phase of the one selected variable delay pulse with a phase of the locked delay pulse;
    (g) deciding whether the phases are substantially identical; and
    (h) performing a fusing operation to maintain the selection of the substantially identical variable delay pulse.

10. The method of claim 9, further including deciding whether the phases are identical through a generation of an up/down signal as a phase comparison signal between the locked delay pulse and the selected variable delay pulse.

11. The method of claim 9, further including deciding whether the phases are identical through a generation of a count signal as a phase comparison signal between the locked delay pulse and the selected variable delay pulse.

12. The method of claim 9, further including repetitively performing (b) through (h) at each determination temperature when the number of determination temperatures is more than one.

13. A temperature sensing circuit using a delay locked loop, comprising:
    a locked delay unit configured to generate a locked delay pulse having a constant delay regardless of a temperature change;
    a variable delay unit configured to generate a plurality of variable delay pulses having a different delay depending upon the temperature change;
    a plurality of delay locking units, each delay locking unit configured to independently receive a plurality of determination temperatures, each delay locking unit configured to select a variable delay pulse to lock the locked delay pulse to the variable delay pulse generated under a determination temperature state, so as to lock the pulses in a compensation operating mode, each delay locking unit configured to output the variable delay pulses locked to corresponding ones of determination temperatures; and
    at least one decision control unit configured to compare a phase of at least one of the variable delay pulses output from the delay locking units with a phase of the locked delay pulse, and to output at least one temperature signal.

14. The circuit of claim 13, wherein each of the delay locking units comprises:
    a phase sensor configured to repetitively compare a phase of one of the variable delay pulses with a phase of the locked delay pulse, and to generate a corresponding comparison signal, until the phases are locked;
    a multiplexer configured to repetitively select one variable delay pulse corresponding to the comparison signal of the phase sensor, from the variable delay pulses, and to output the selected variable delay pulse to the phase sensor;

a counter configured to generate a count signal to provide a selection reference of a variable delay pulse in the multiplexer responsive to the comparison signal output from the phase sensor; and a fusing unit configured to maintain the selected variable delay pulse.

15. The circuit of claim 13, further comprising a multiplexer configured to select one delay locking unit output from the plurality of delay locking unit outputs.

16. The circuit of claim 13, wherein the temperature sensing circuit comprises a plurality of decision control units that are adapted corresponding to a number of the delay locking units individually corresponding thereto.

17. The circuit of claim 16, wherein the plurality of decision control units are configured to simultaneously compare respective variable delay pulses provided from the respective delay locking units, with the locked delay pulse, and output a plurality of temperature signals.

18. A temperature sensing compensation method using a delay locked loop, the method comprising:
  (a) generating a locked delay pulse having a locked delay regardless of temperature at a specific determination temperature;
  (b) generating a plurality of variable delay pulses having a delay changed according to a temperature change;
  (c) determining a first determination temperature;
  (d) selecting one variable delay pulse corresponding to the first determination temperature from the plurality of variable delay pulses;
  (e) comparing the one selected variable delay pulse with the locked delay pulse;
  (f) when the locked delay pulse is locked to the one selected variable delay pulse, outputting a temperature signal; and
  (g) fusing a first fusing unit to maintain the first selected variable delay pulse.

19. The method of claim 18, wherein when the locked delay pulse is not locked to the one selected variable delay pulse, repeating (d) and (e) until the locked delay pulse is locked to the one selected variable delay pulse.

20. The method of claim 19, further comprising:
selecting one locked variable delay pulse from the selected variable delay pulses; and
outputting the temperature signal responsive to the selection.

21. The method of claim 19, further comprising:
outputting a second temperature signal.

22. The method of claim 18, further comprising:
determining a second determination temperature;
selecting a second variable delay pulse corresponding to the second determination temperature from the plurality of variable delay pulses;
comparing the second selected variable delay pulse with the locked delay pulse;
when the locked delay pulse is locked to the second selected variable delay pulse, outputting the temperature signal; and
fusing a second fusing unit to maintain the second selected variable delay pulse.

* * * * *